US006347103B1

(12) United States Patent
Song et al.

(10) Patent No.: US 6,347,103 B1
(45) Date of Patent: Feb. 12, 2002

(54) LIGHT SOURCE MODULE WITH TWO WAVELENGTH

(75) Inventors: Ki Chang Song; Young Joo Yee; Jong Uk Bu, all of Kyonggi-do (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 09/400,291

(22) Filed: Sep. 21, 1999

(30) Foreign Application Priority Data

Sep. 26, 1998 (KR) ............................................. 98-40142
Sep. 30, 1998 (KR) ............................................. 98-41221

(51) Int. Cl.[7] ............................ H01S 2/04; H01S 5/00; H01S 3/08; H01S 3/10
(52) U.S. Cl. ............................ 372/36; 372/43; 372/99; 372/23
(58) Field of Search ............................ 372/23, 36, 43, 372/50, 99, 108, 22

(56) References Cited

U.S. PATENT DOCUMENTS

| 4,881,237 A | * | 11/1989 | Donnelly ...................... 372/50 |
| 5,100,220 A | * | 3/1992 | Voegeli ........................ 372/99 |
| 5,642,373 A | * | 6/1997 | Kamizato et al. ............. 372/50 |
| 5,671,243 A | * | 9/1997 | Yap .............................. 372/50 |
| 5,912,910 A | * | 6/1999 | Sanders et al. ............... 372/22 |

* cited by examiner

Primary Examiner—Quyen Leung
(74) Attorney, Agent, or Firm—Fleshner & Kim, LLP

(57) ABSTRACT

Light source module with two wavelengths including a first and a second laser diodes each for emitting a laser beam with a wavelength different from each other, and a submount formed between the first and second laser diodes having a vertical mirror surface vertical to bonding surfaces of the first and second laser diodes for reflecting laser beams from the first and second laser diodes in a same direction.

19 Claims, 14 Drawing Sheets

LIGHT SOURCE MODULE WITH TWO WAVELENGTH

BACKGROUND OF THE INVENTION

Field of the Invention

The present invention relates to a light source module with two wavelengths which emits a light beam with two wavelengths.

Background of the Invention

As technologies in optical disk fields advance, DVDs are developed, which have a size 6 to 7 times larger than a capacity of CD for exclusive use of audio, an optical disk for use as a computer supplementary memory, or present CD. Though an optical pickup for reading the DVD developed together with the DVD presently is interchangeable with CD, the optical pickup for reading the DVD has no interchangeability with CD-R(Recordable) disk, which is a WORM (Write Once Read Many) type having a reflexion ratio higher at 780 nm wavelength and lower at 650 nm wavelength, because a laser beam source used in the optical pickup has a wavelength of 650 nm. Therefore, the interchangeability with a writable CD(CD-R), of which market expands rapidly, is an important matter for the optical pickups for DVD-ROM, or DVD-RAM. As shown in FIG. 1, a method available presently is use of two LD(Laser Diode) each with a wavelength of 650 mm or 780 mm for switching to a disk desired to read.

Referring to FIG. 1, a related art optical pickup is provided with an LD 1 of 650 nm, LD 4 of 780 nm, a first collimator 2 for the LD of 650 nm, a second collimator 5 for the LD of 780 nm, a first beam splitter 3 for directing a laser beam from the 780 nm LD toward a 45 degree reflection mirror and passing a laser beam from the 650 nm LD, the 45 degree reflection mirror 7, an objective lens 8, a second beam splitter 6 for directing a laser beam reflected at a disk toward a photodetector 12, a focusing lens 9 for focusing a beam onto the photodetector 12, and the photodetector 12 for generating an objective lens servo signal and an information signal recorded on the optical disk.

Referring to FIG. 1, the operation of the related art optical pickup will be explained. When a DVD is read, the 780 nm LD 4 is turned off, and only the 650 nm LD 1 is operative, to emit a laser beam, which is collimated by the first collimator 2, passes through the first beam splitter 3 and the second beam splitter 6 in succession, is directed to the objective lens 8 by the 45 degree reflection mirror 7. The beam incident to the objective lens 8 is focused onto the DVD 10 by the objective lens 8, and reflected at the DVD 10 to travel a beam path in a reverse direction, a portion of which is focused onto the photodetector 12 by the second beam splitter 6. As a laser beam is incident to the photodetector 12, the photodetector 12 provides information signal recorded on a objective lens servo and the disk. In reading a CD or a CD-R, the light source is changed over from 650 nm LD to 780 nm LD, and the information is read under the same principle. Referring to FIG. 1, when the CD or CD-R are read, an effective diameter of the beam incident to the objective lens is smaller than the same when DVD is read, because, when the 780 LD is used, it is required to reduce an effective diameter of the beam incident to the objective lens to form a spot of approx. 1~1.2 μm since the objective lens is provided exclusively for DVD.

The 780 nm LD required to provide additionally when the aforementioned optical pickup designed for reading DVD and CD group disk is to read the CD-R causes a cost high, complicate to fabricate the optical pickup, and increases the size.

SUMMARY OF THE INVENTION

Accordingly, the present invention is directed to a light source module with two wavelengths that substantially obviates one or more of the problems due to limitations and disadvantages of the related art.

An object of the present invention is to provide a light source module with two wavelengths, in which light sources with two wavelengths are integrated into one module, to provide a light source module with two wavelengths, which is easy to fabricate and minimize a bulk.

Another object of the present invention is to provide a light source with two wavelengths which can emit light beams of different wavelengths using a submount which can be passive aligned.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the light source module with two wavelengths includes a first and a second laser diodes each for emitting a laser beam with a wavelength different from each other, and a submount formed between the first and second laser diodes having a vertical mirror surface vertical to bonding surfaces of the first and second laser diodes for reflecting laser beams from the first and second laser diodes in a same direction.

The vertical mirror surface is either a flat or parabolic mirror disposed at 45° to the laser beams incident thereto.

The light source module further includes a stem for supporting the submount having the vertical mirror surface, and the first and second laser diodes, and a cap fitted with a collimator, the cap formed over the stem for protecting the submount, and the collimator for collimating respective laser beams emitted from the first and second laser diodes and reflected at the vertical mirror surface toward an external optical system.

In other aspect of the present invention, there is provided a light source module with two wavelengths including a first and a second laser diodes each for emitting a laser beam with a wavelength different from each other, a mirror block disposed between the first and second laser diodes and having a vertical mirror surface for reflecting laser beams from the first and second diodes in the same direction, and a submount having a first and a second recesses formed in a fixed depth under the first and second laser diodes and the mirror block for aligning the first and second laser diodes and the mirror block, and a third recess formed in a fixed depth having a mirror surface for re-reflecting the laser beam reflected at the mirror block in a fixed direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings.

First Embodiment

Figure 1:
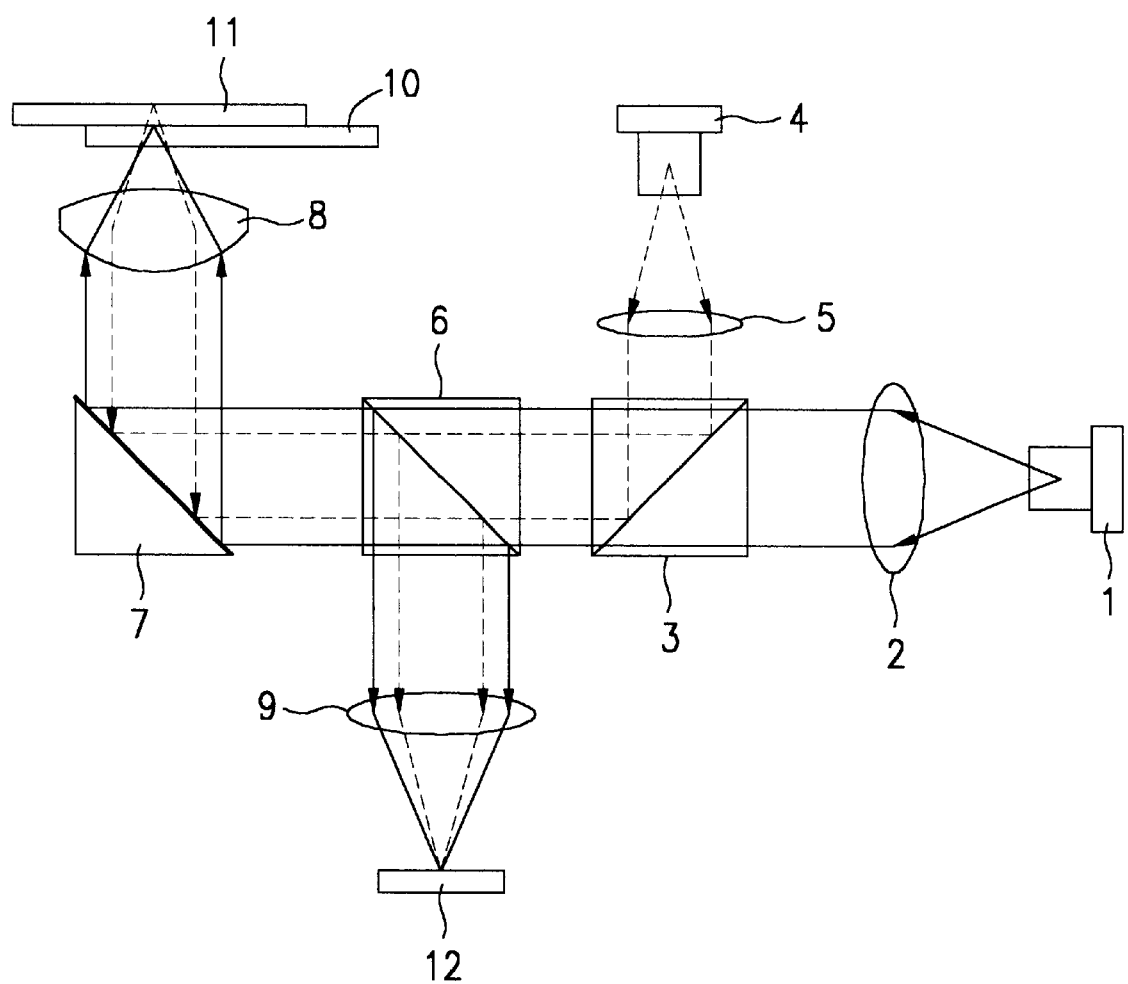
FIG. 1 schematically illustrates a related art optical pickup.
Figure 2A:
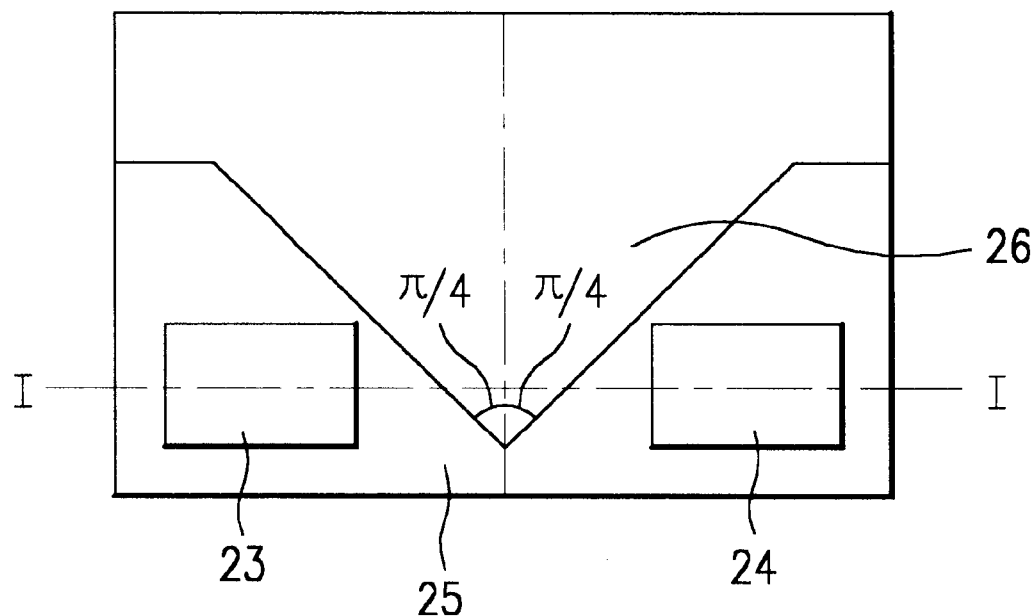
FIGS. 2A, 2B, and 2C schematically illustrate a plan view, a sectional view and a perspective view of a light source module with two wavelengths in accordance with a first preferred embodiment of the present invention, respectively.
Figure 2B:
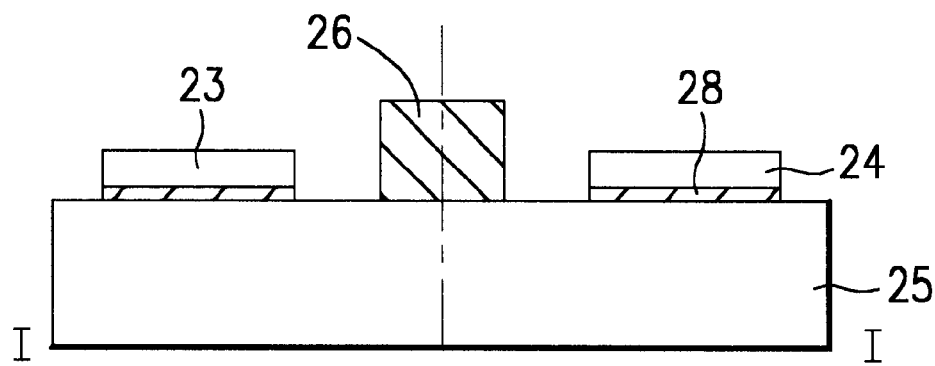
Figure 2C:
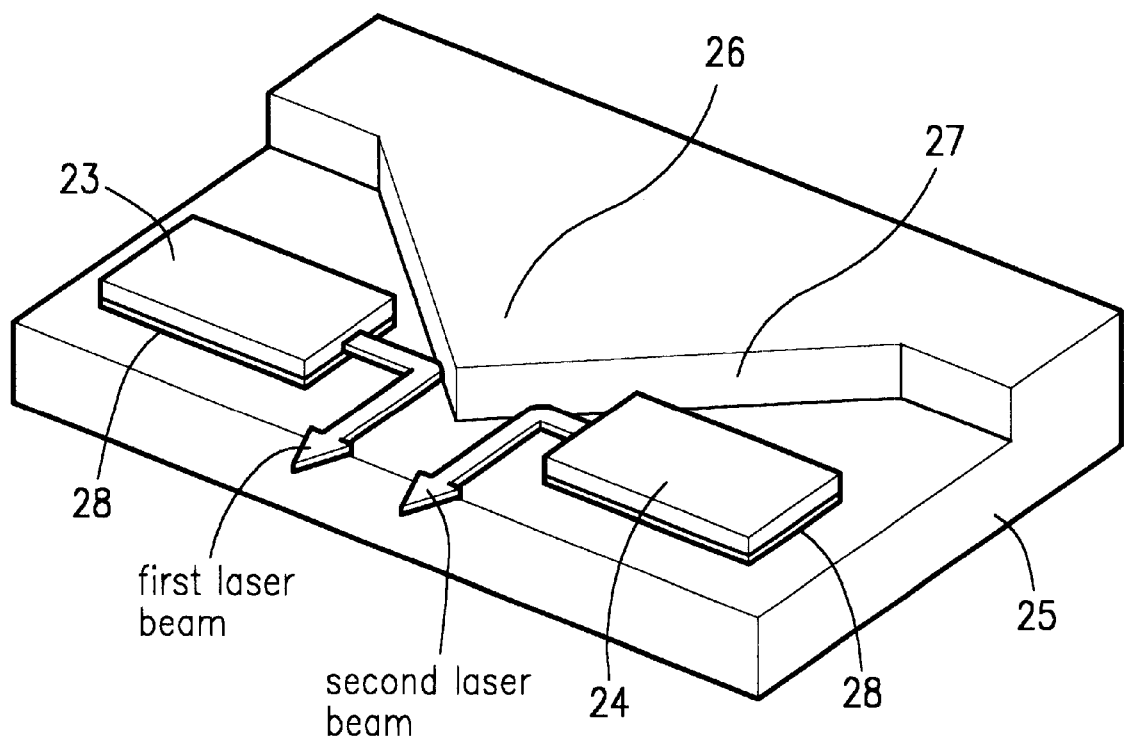

FIGS. 2A illustrates a plan view a light source module with two wavelengths in accordance with a first preferred embodiment of the present invention, FIGS. 2B illustrates a section across line I—I in FIG. 2A, and FIG. 2C illustrates a perspective view of FIG. 2A.

Referring to FIGS. 2A, 2B and 2C, the light source module with two wavelengths in accordance with a first preferred embodiment of the present invention includes a first laser diode 23 of 650 nm and a second laser diode 24 of 780 nm each formed on a submount 25, and an alignment for aligning and supporting the first and second diodes 23 and 24 between each of the first and second laser diodes 23 and 24 and the submount 25. And, there is triangular column form of mirror 26 between the first and second laser diodes 23 and 24. Mirror surfaces 27 of the mirror 26 of Au or Al are vertical to a bonding surface of the first and second laser diodes 23 and 24 and at 45° to a first, and a second laser beams from the first and the second laser diodes 23 and 24, respectively. This vertical mirror surfaces 27 reflect the first and second laser beams 90° to travel the first and second laser beams in parallel toward an identical optical system.

The submount having 45° mirrors in the light source module with two wavelengths may be formed by the following two methods.

First, the submount is formed by using thick photoresist.

Alignment plates 28 on which two laser diodes 23 and 24 are to be fitted are either deposited or etched(dry or wet) on the submount 25. Then, a thick photoresist is formed on the submount to a thickness deeper than a mirror in the optical pickup module, and a triangular column form of photo mask pattern is transferred by photolithography and developed, to form a micron structure of 45° mirror 26 of a triangular column form having two vertical mirror surfaces. Au or Al is coated on the vertical mirror surfaces for improving a reflection ratio of the two 45° vertical mirror surfaces, thereby completing formation of the submount. Two laser diodes with different wavelengths are aligned and bonded on the alignment plates 28 on the submount 25 completed thus, thereby completing fabrication of the light source module with two wavelengths.

Second, the submount is formed by plating.

Two alignment plates 28 on which two laser diodes 23 and 24 are to be fitted are either deposited or etched(dry or wet) on the submount 25. A mould for forming a triangular column is formed of photoresist or polymer by photolithography and etching, and a micron structure of 45° mirror of a triangular column form is formed of Au or Ni. Then, the mould is removed, the two laser diodes are aligned and bonded, to completing fabrication of a light source module of two wavelengths.

Third, the submount is formed by silicon anisotropic etching.

The silicon anisotropic etching facilitates formation of micron structure by utilizing different etch ratio along silicon crystal orientations, wherein, if a body aligned at 45° to a primary flat zone of a silicon substrate in a (100) crystal orientation is etched in an anisotropic etch solution(for example, KOH, EDP, TMAH, and etc.,), a {100} crystal plane is formed, which is perpendicular to the silicon substrate. Therefore, a triangular column projection at ±45° to the primary flat zone of the submount 25 is defined and subjected to anisotropic etching, a mirror 26 of a triangular column form at ±45° to the primary flat zone of the submount 25 is formed, which mirror 26 has a vertical mirror surface 27 vertical to the submount 25. The mask used in the anisotropic etching is formed of silicon oxide, silicon nitride or Au film. The alignment plates 28 on which the two laser diodes 23 and 24 are to be fitted may be formed by photolithography and dry etching or photolithography and anisotropic etching before or after the anisotropic etching for forming the 45° mirror structure formation. An Au or Al film is coated on the vertical mirror surface 27 of the 45° mirror formed thus for improving a reflection ratio and reducing surface roughness. The Au or Al film are applied by deposition or electric plating.

Fourth, the submount is formed by silicon dry etching.

An etch mask is formed to define a triangular column form projection by photolithography, and the etch mask is used in anisotropic dry etching of the submount to a depth which can be used for an optical pickup module, to form a 45° mirror 26. The two vertical sidewalls of the etched triangular column form the vertical mirror surfaces 27, and the alignment plates 28 on which the two laser diodes 23 and 24 are to be fitted may be formed by photolithography and dry etching or photolithography and anisotropic dry or wet etching before or after the anisotropic dry etching for forming the 45° mirror structure. And, alike the foregoing different methods, an Au or Al film may be formed on the vertical mirror surfaces 27 of the 45° mirror 26 by deposition or electrical plating for improving a reflection ratio and reducing a surface roughness. Thus, because the fabrication process of the submount has an interchangeability with a CMOS process, the photodiodes may be integrated at an appropriate location of the submount before formation of the 45° mirror structure of the triangular column form, later.

Second Embodiment

Figure 3A:
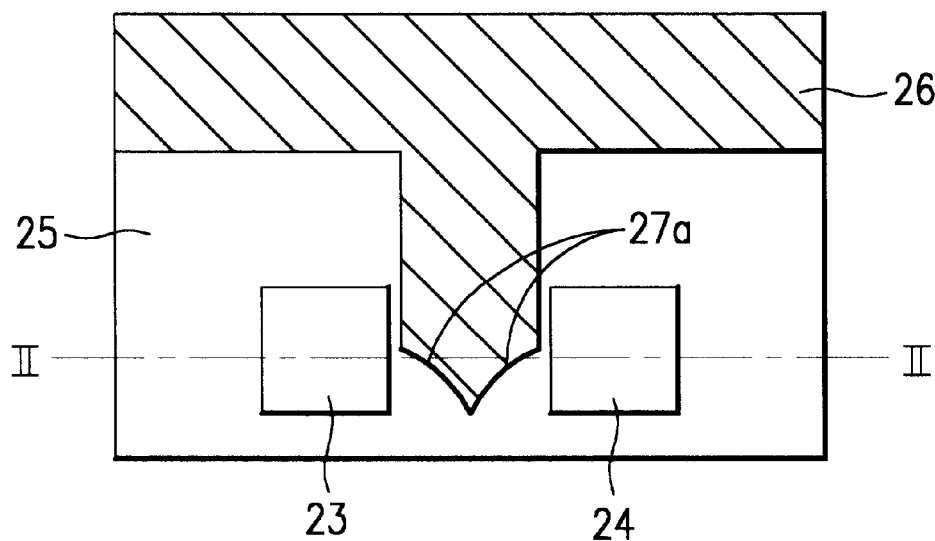
FIGS. 3A, 3B, and 3C schematically illustrate a plan, a sectional and a perspective views of a light source module with two wavelengths in accordance with a second preferred embodiment of the present invention, respectively.
Figure 3B:
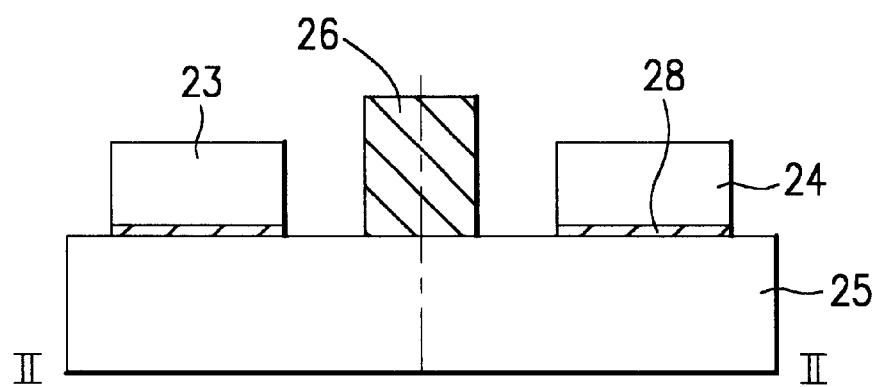
Figure 3C:
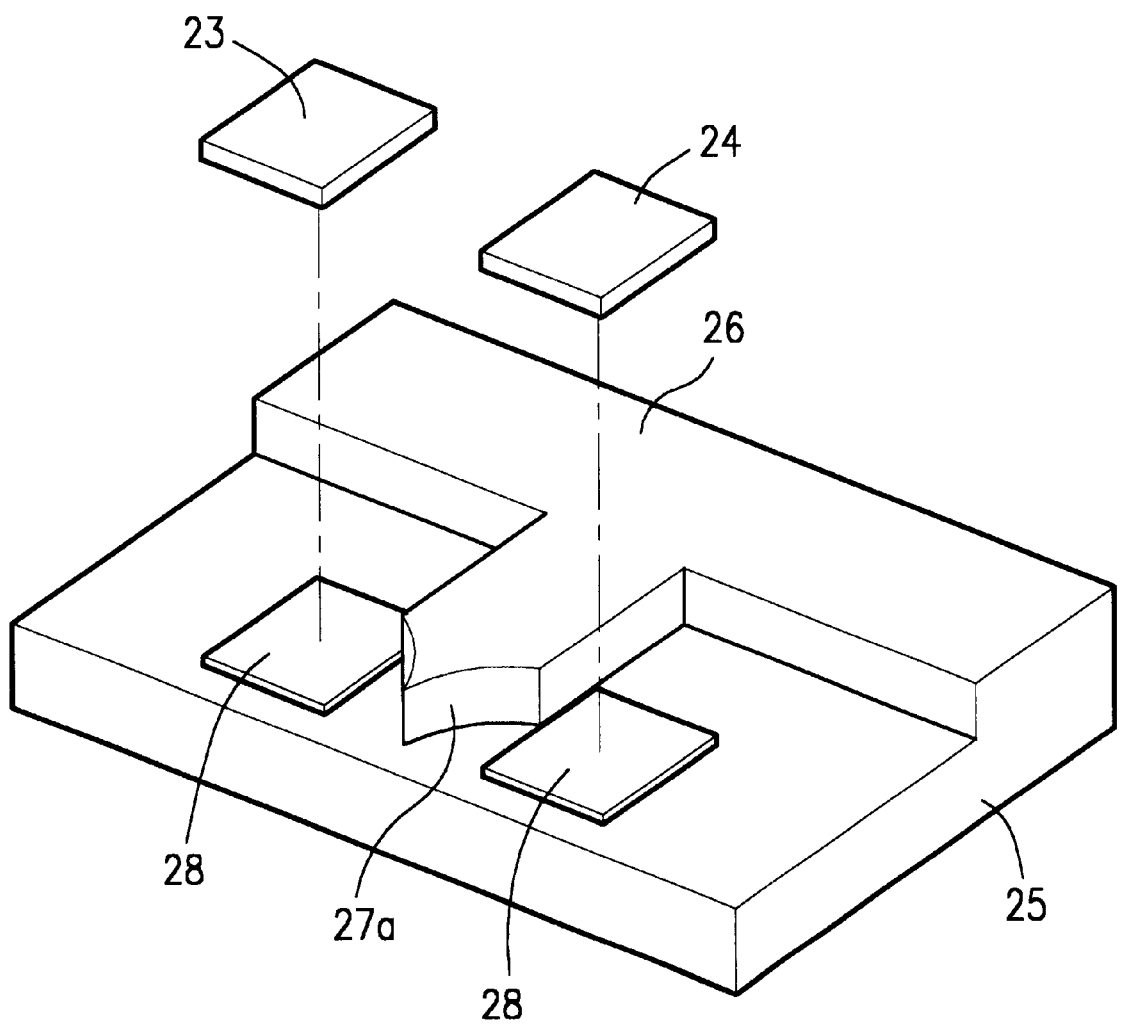
Figure 4A:
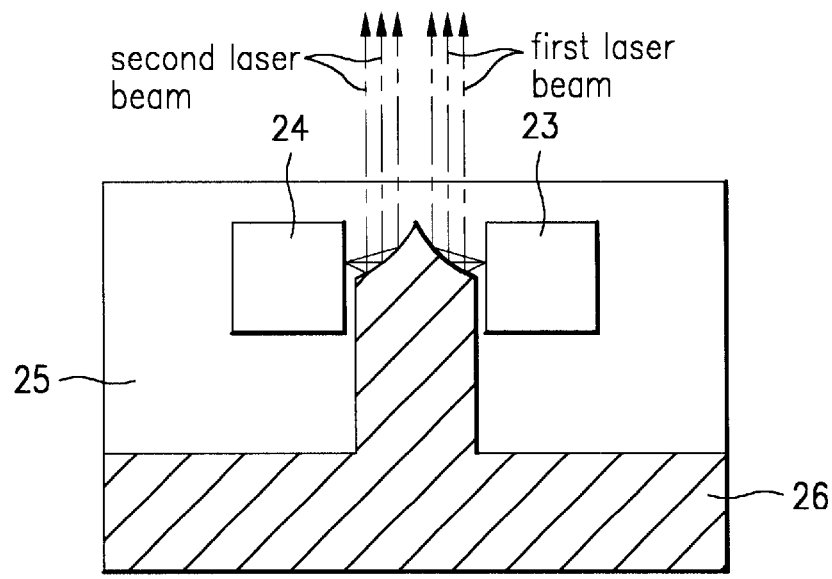
FIGS. 4A, and 4B illustrate emission of laser beams from a light source module with two wavelengths in accordance with a second preferred embodiment of the present invention, respectively.
Figure 4B:
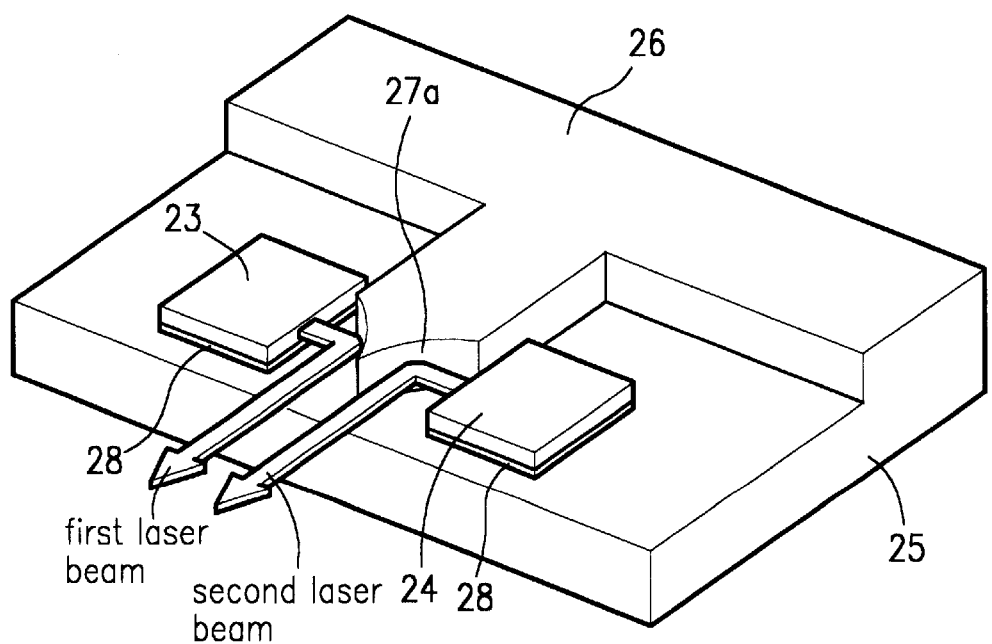
Figure 5A:
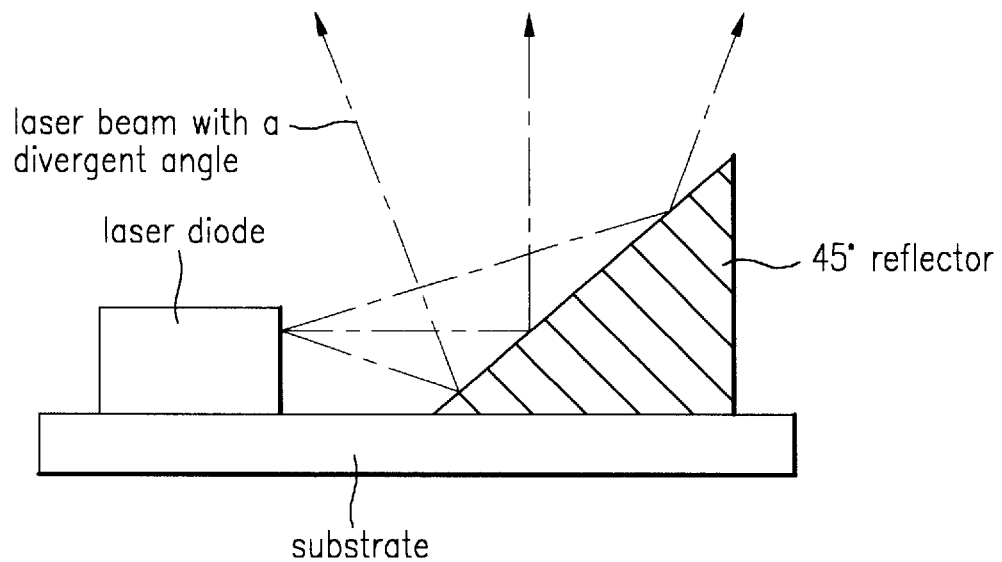
FIGS. 5A, and 5B illustrate an emission of a laser beam from a related art light source module respectively, provided for comparison to FIGS. 4A and 4B.
Figure 5B:
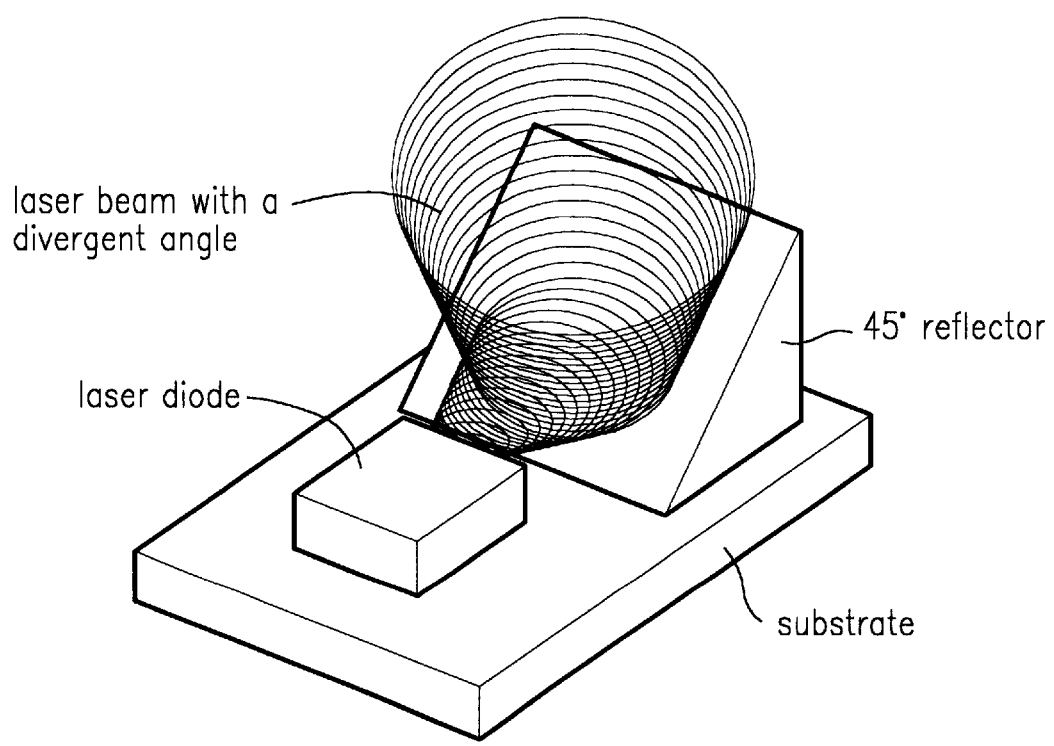
Figure 6A:
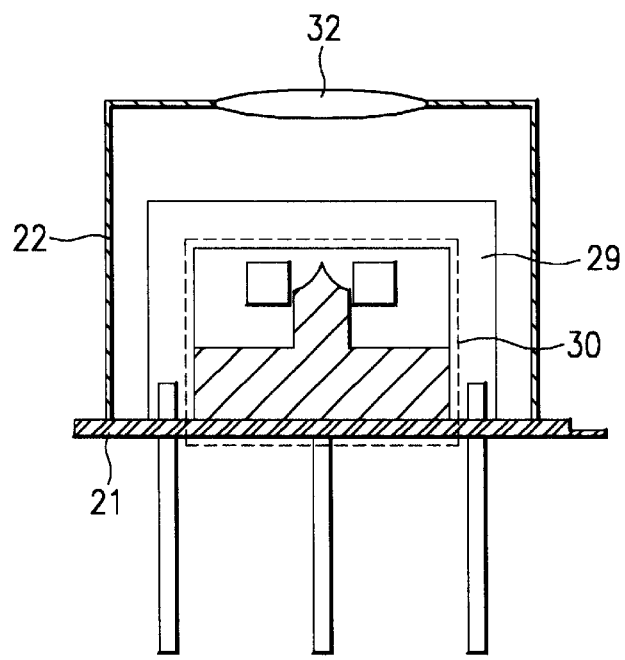
FIGS. 6A and 6B illustrate a light source package with two wavelengths of the present invention, respectively.
Figure 6B:
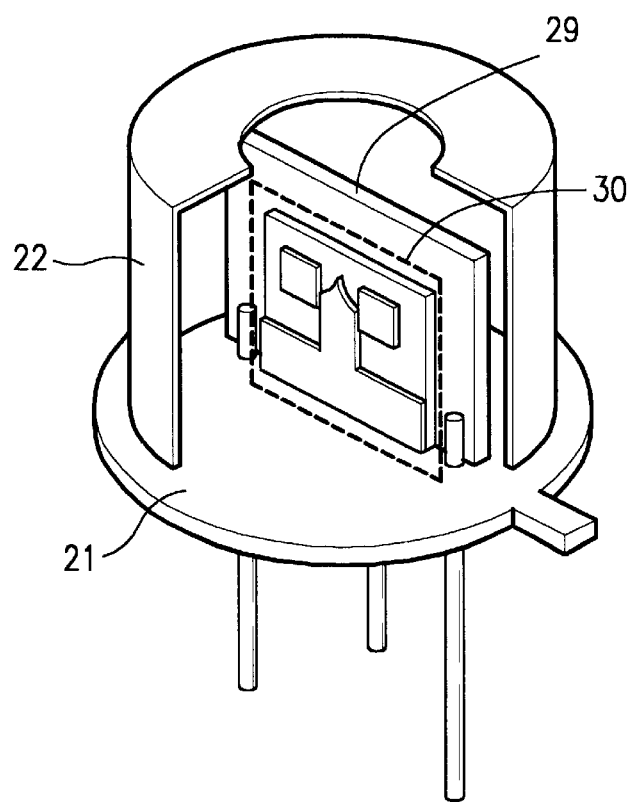

FIG. 3A illustrates a plan view of a light source module with two wavelengths in accordance with a second preferred embodiment of the present invention, FIG. 3B illustrates a section across section II—II in FIG. 3A, and FIG. 3C illustrates a perspective view of FIG. 3A. As shown in FIG. 3A, 3B and 3C, the second embodiment of the present invention is similar to a structure of the first embodiment, except the vertical mirror surfaces 27 of the mirror 26 are parabolic 27a. As shown in FIGS. 4A and 4B, in the second embodiment, the vertical mirror surfaces 27 of the mirrors 26 are formed parabolic 27a for collimating the laser beams incident to the parabolic mirrors 27a for providing a more intensive laser beam. FIGS. 5A, and 5B illustrate a sectional and a perspective views showing a laser beam reflected at a flat 45° reflection mirror used in a related art light source module, respectively. As shown, an angle of divergence of the laser beam from the laser diode is maintained even after the beam is reflected at the 45° reflection mirror. As an intensity of light per unit area is reversely proportional to square of distance, with a beam spot size larger proportional to the distance, the laser beam from the laser beam source is involved in significant drop of a light source efficiency. The second embodiment of the present invention employs the parabolic mirrors 27a for improving such a disadvantage. Detailed explanation on methods for fabricating a submount having the parabolic mirror will be omitted since the methods are identical to the first, second and fourth methods of the first embodiment. The third method in the first embodiment is applicable, not to a parabolic mirror surface of the second embodiment, but to a vertical or sloped mirror surface. As shown in FIGS. 6A and 6B, the light source module may be packaged for enhancing the focusing effect of the laser beam. A vertical submount 29 having the laser light source 30 with two wavelengths fabricated according to the first or second embodiment is fitted to a stem 21, and a cap 22 for covering the submount 29 to protect the laser light source 30 with two wavelengths. The cap 22 is fitted with a collimator 32 for collimating the laser beam from the laser light source 30 with two wavelengths, for providing more intensive laser beam toward an external optical system.

Third Embodiment

Figure 7A:
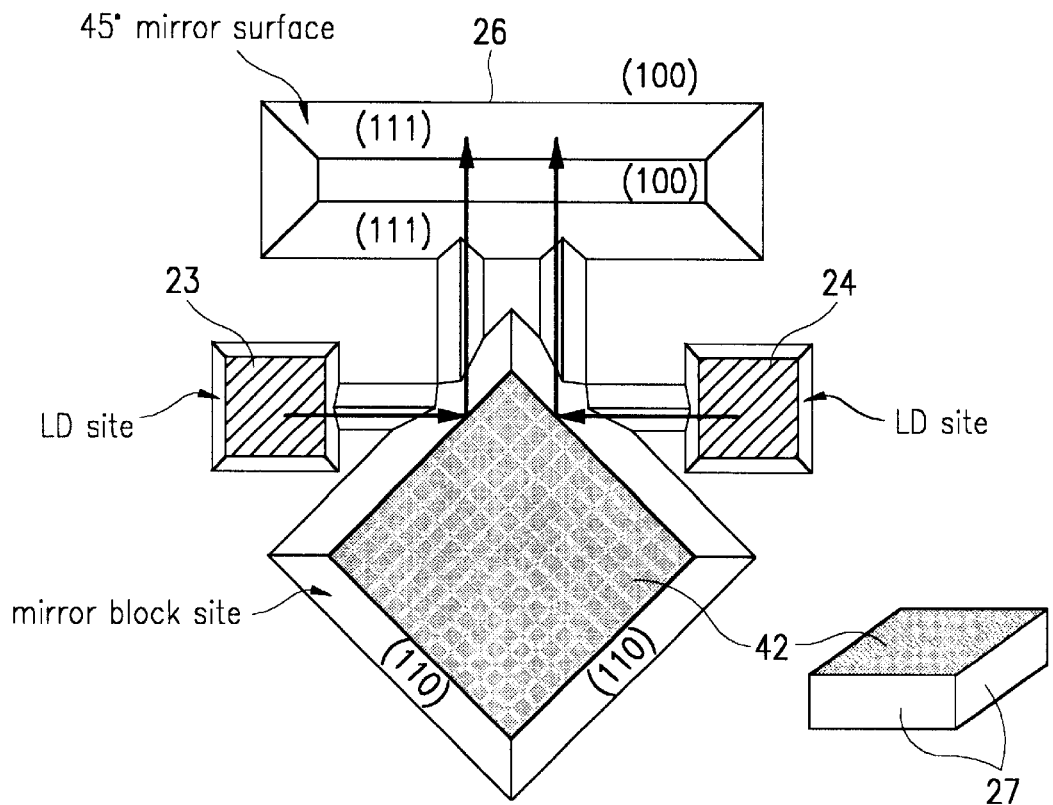
FIGS. 7A, and 7B illustrate emission of laser beams from a light source module with two wavelengths in accordance with a third preferred embodiment of the present invention, respectively.
Figure 7B:
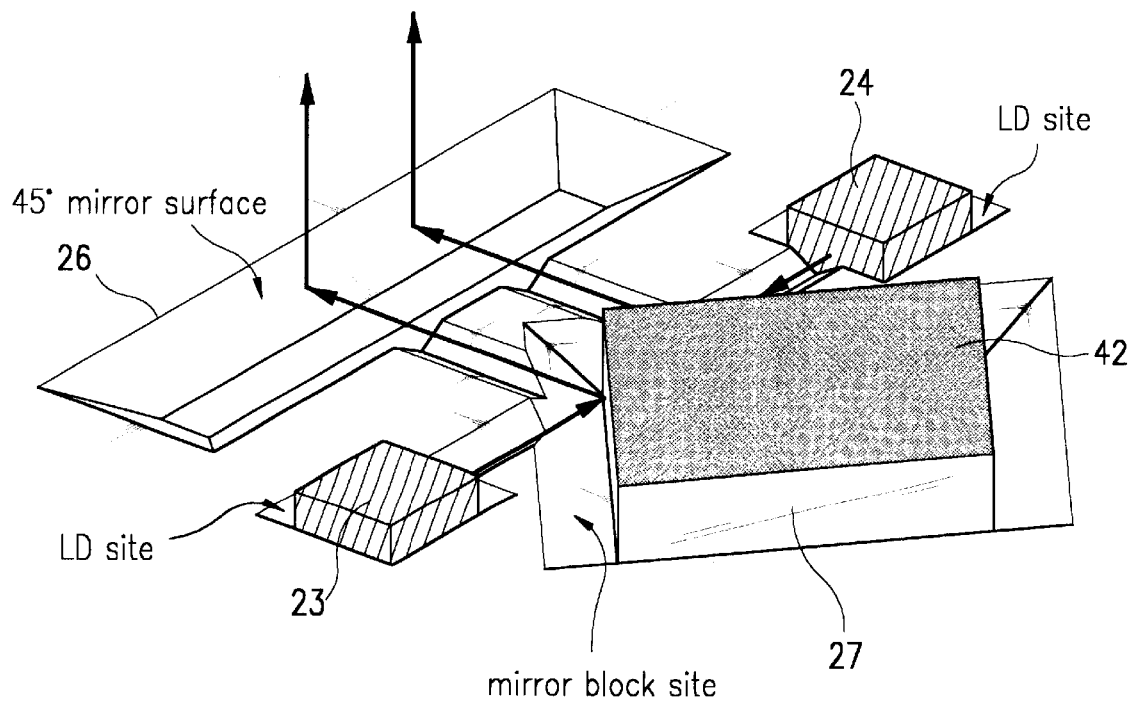

FIGS. 7A, and 7B illustrate plan views showing a light source module with two wavelengths in accordance with a third preferred embodiment of the present invention respectively.

Referring to FIGS. 7A and 7B, the light source module with two wavelengths in accordance with a third preferred embodiment of the present invention includes a silicon submount having a mirror 26 with a 45° mirror surface, a mirror block 42 having vertical surfaces 27 at sides thereof for deflecting laser beams incident thereto by 90°, and a 650 nm first laser diode 23 and a 780 mm laser diode 24 both disposed to emit laser beams toward the mirror block 42. The mirror block 42 and the first and second laser diodes 23 and 24 are aligned on a underlying site. That is, the site which permits manual assembly of the mirror 26 with the 45° mirror surface section and different components(the mirror block, and the first and second laser diodes) is formed in a form of a recess by anisotropic wet etching of the submount to a depth. And, the submount has grooves formed along paths of the laser beams emitted from the first and second laser diode 23 and 24. The mirror block 42 is disposed 45° skewed to the first and second laser diodes 23 and 24 and the mirror 26, and a mirror surface of the mirror has a reflection film(not shown) formed of Au or Al. The mirror block 42 is disposed 45° skewed to the first and second laser diodes 23 and 24 and the mirror 26, for deflecting both of the laser beams emitted opposite to each other by 90°, so that the laser beams with two wavelengths are incident to the mirror 26 with 45° mirror surface section within a distance approx. 60 $\mu$m.

A method for fabricating a light source module with two wavelengths in accordance with a third embodiment of the present invention will be explained with reference to FIGS. 8A~8D.

Figure 8A:
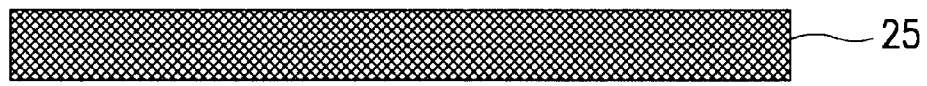
FIGS. 8A~8D illustrate the steps of a method for fabricating a light source module with two wavelengths in accordance with a third preferred embodiment of the present invention.
Figure 8B:
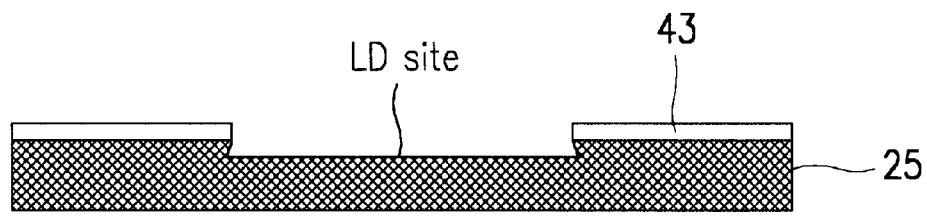
Figure 8C:
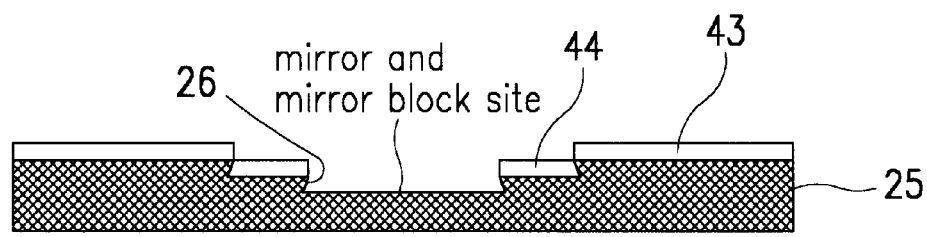
Figure 8D:
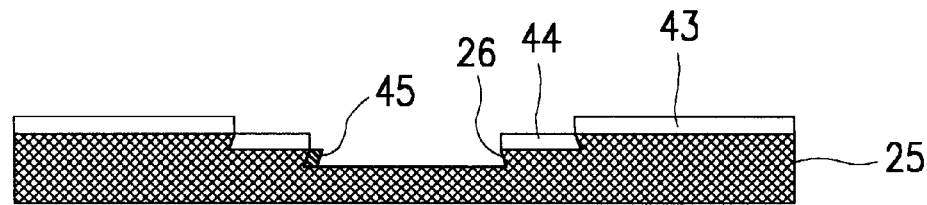
Figure 9A:
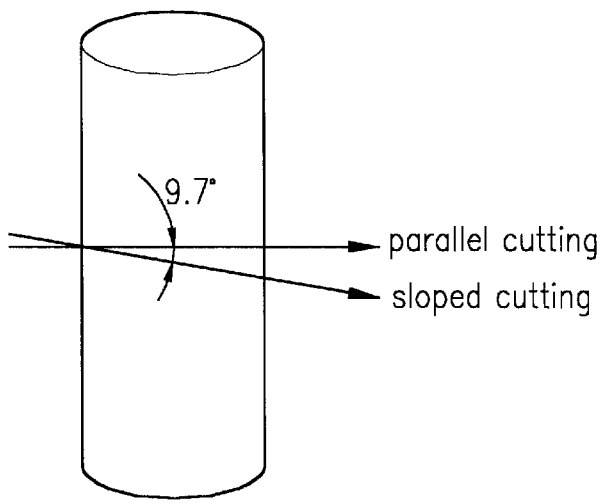
FIG. 9A illustrates a grown silicon wafer column.
Figure 9B:
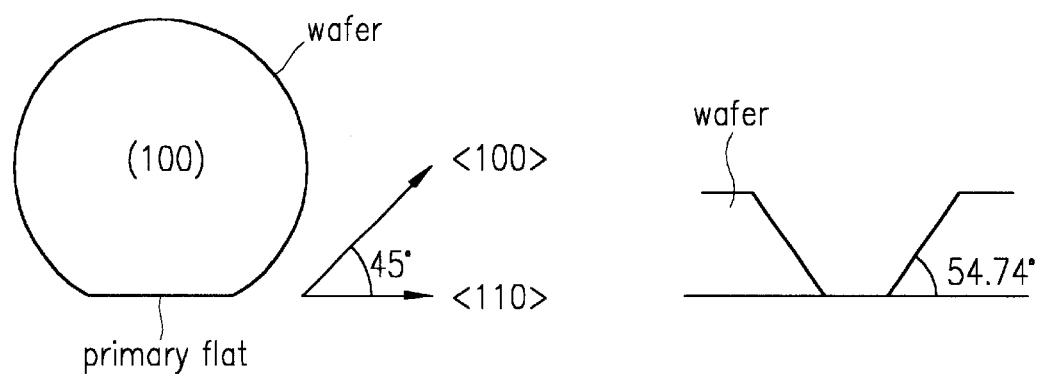
FIG. 9B illustrates a plan view of a wafer obtained by cutting the wafer column in FIG. 9A in parallel, and a section of the wafer etched.
Figure 9C:
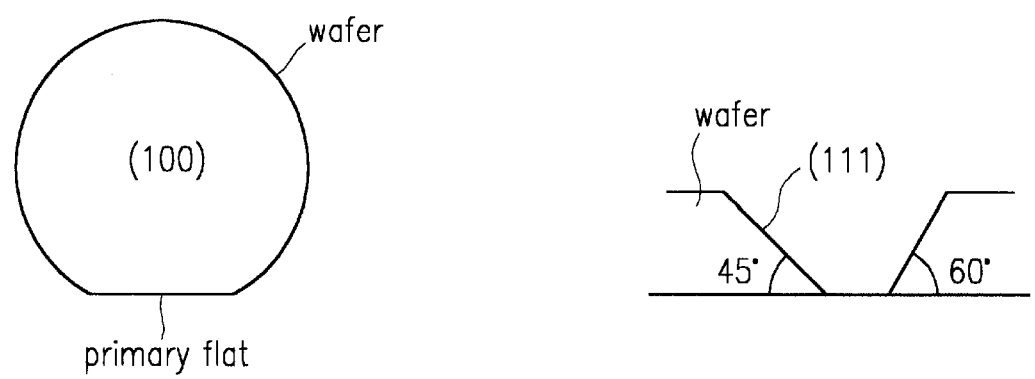
FIG. 9C illustrates a section of a wafer obtained by cutting the wafer column in FIG. 9A with a slope of approx. 9.7°, and a section showing the wafer etched.

Referring to FIG. 8A, a silicon wafer is provided for use as a submount 25, which is cut 9.7° off axis angle. As shown in FIG. 9A, this wafer is obtained by cutting a grown silicon wafer column, not parallel, but approx. 9.7° sloped to a plane. FIG. 9B illustrates a plan view of a wafer obtained by cutting the wafer column in FIG. 9A in parallel, and a section of the wafer etched, and FIG. 9C illustrates a section of a wafer obtained by cutting the wafer column in FIG. 9A with a slope of approx. 9.7°, and a section showing the wafer etched. When a wafer cut in parallel as shown in FIG. 9B is subjected to anisotropic etching, a slope, not with an angle of 45°, but with an angle of 54.74°, can be obtained owing to an etch rate selectivity to a (100) plane and a (111) plane. However, when a wafer cut at approx. 9.7° off axis angle as shown in FIG. 9C is subjected to anisotropic etching, a 45° mirror surface in (111) plane can be obtained with easy, which has a good surface roughness. In this instance, though the 45° mirror surface can be obtained, not from both sides, but only from one side, as the present invention is in need of the one side mirror, it does not matters. Then, as shown in FIG. 8B, a first mask material 43 is formed of one selected from a silicon oxide, silicon nitride, and Au on the submount 25, and subjected to patterning, to expose a portion of the submount 25. The submount 25 is subjected to first anisotropic etching, to form LD sites on which the 650 nm first laser diode and the 780 nm second laser diode are to be disposed by using KOH solution as an etchant, when the LD sites are formed in a <110> direction parallel to the primary flat of the wafer. Then, as shown in FIG. 8C, a second mask material 44 identical to the first mask material 43 is formed on the etched submount 25, and subjected to patterning, to expose a portion of submount 25. The exposed submount 25 is subjected to anisotropic etching for the second time, to form a mirror with 45° mirror surface section and a mirror block site for disposing the mirror block by using KOH solution as an etchant the same as the first etching, when the mirror 26 with 45° mirror surface section is formed in a <110> direction parallel to the primary flat of the wafer, and the mirror block site is formed in a <100> direction which is at 45° to the primary flat of the wafer. As shown in FIG. 7A, the 45° mirror surface of the mirror 26 is formed in a (111) plane. Then, as shown in FIG. 8D, a reflection film 45 is formed of one of Au and Al on the 45° mirror surface of the mirror 26, for improving a reflection ratio of the mirror surface and reducing a surface roughness. The reflection film 45 may be deposited or electrically plated. Though not shown in the drawing, the first and second laser diodes and the mirror block are aligned on respective sites, to complete fabrication of the light source module with two wavelengths. The mirror block deflects the laser beams with two wavelengths emitted facing each other by 90° to direct toward the 45° section mirror. The mirror block may be formed of one selected from ceramic, glass, metal and silicon, with a mirror formed at sides thereof for reflecting the laser beams.

Fourth Embodiment

Figure 10:
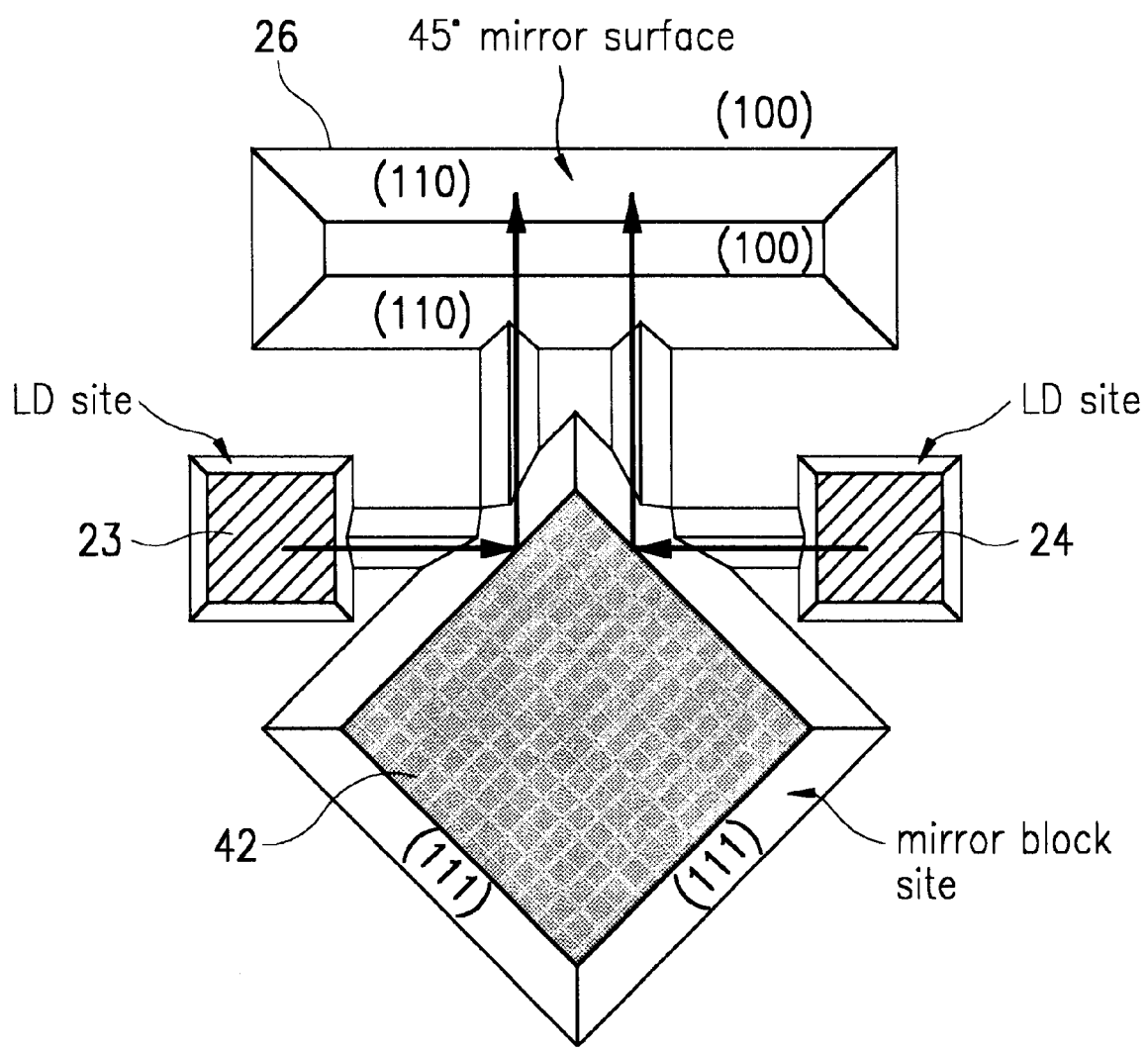
FIG. 10 illustrates a light source module with two wavelengths in accordance with a fourth preferred embodiment of the present invention, schematically; and, FIGS. 11 and 12 schematically illustrate an optical pickup of a light source module with two light source module of the present invention, respectively.

FIG. 10 illustrates a light source module with two wavelengths in accordance with a fourth preferred embodiment of the present invention schematically, which has a structure identical to the third embodiment, but slightly different fabricating method.

Referring to FIG. 9B, the method for fabricating a light source module with two wavelengths in accordance with a fourth preferred embodiment of the present invention starts from providing a wafer cut in parallel for use as a submount. The wafer is subjected to anisotropic etching in <100> direction which is at 45° to a primary flat of the wafer, to form a mirror 26 with a 45° mirror surface. That is, the LD sites and the mirror 26 are formed by subjecting the wafer to anisotropic etching in <100> direction which is at 45° to the primary flat of the wafer, and the mirror block site between the LD sites is formed by subjecting the wafer to anisotropic etching in <110> direction which is parallel to the primary flat of the wafer. In this instance, the 45° mirror surface of the mirror 26 is formed in a (110) plane by using EDP solution. A composition of the EDP solution is fixed under a condition in which an amount of oxidation agent is increased with addition of comparatively large amount of water, when a ratio of ethelendiamine: water is ranging 20%~40%. In this instance, an etch rate difference between a (100) plane and (110) plane is approx. 4:1, with an undercut ratio within approx. 10%. A fabrication process other than above is identical to the third embodiment. Since the fabrication process of the present invention has an interchangeability with a CMOS process, the optical detector can be integrated at an appropriate location of the submount before etching is conducted, later.

The operation of the optical pickup having the light source module with two wavelengths applied thereto of the present invention will be explained.

Figure 11:
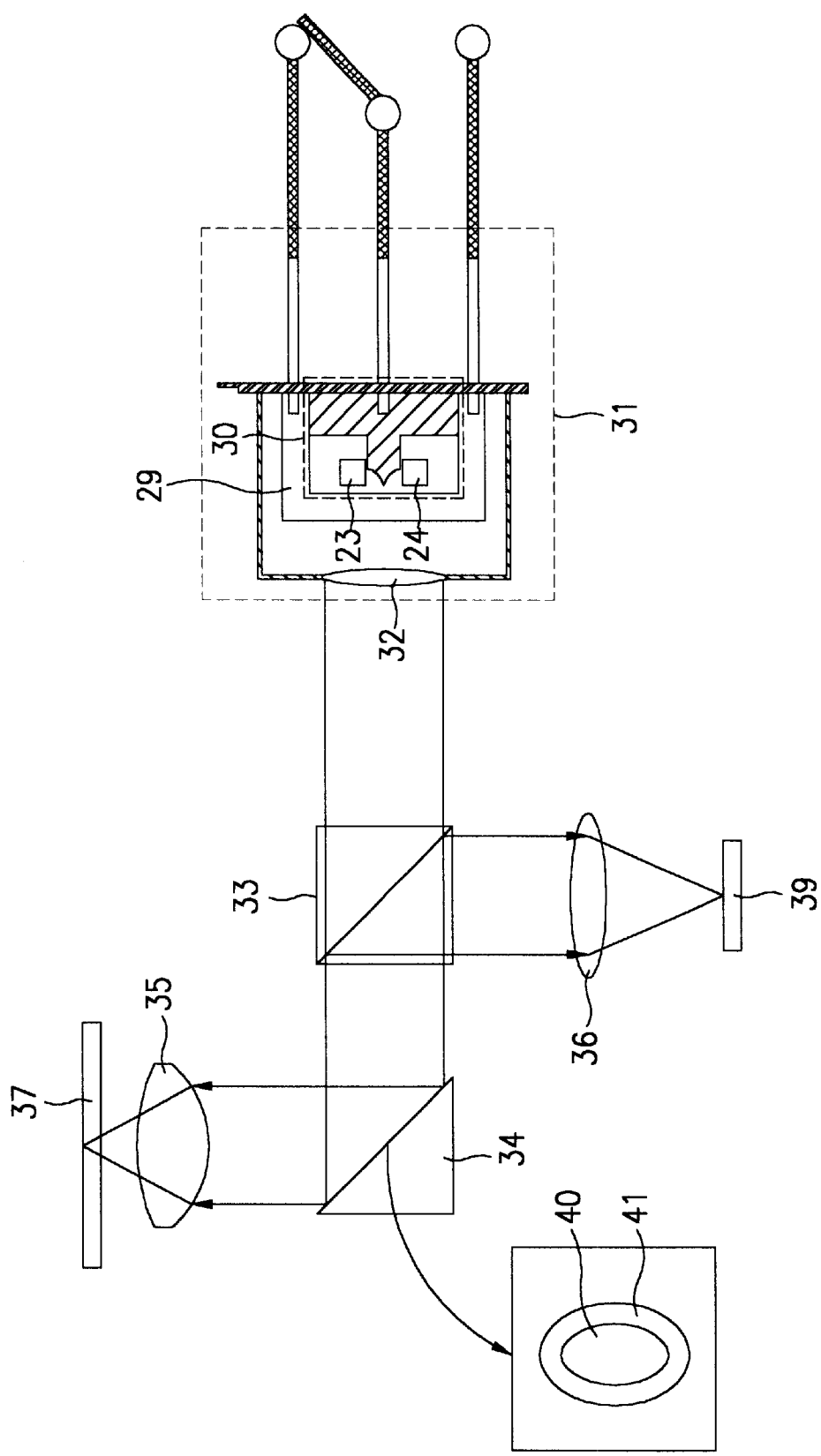

Referring to FIG. 11, when a DVD is to be read, the 780 nm second laser diode 24 in the light source module package 31 with two wavelengths is turned off, and only the 650 nm first laser diode 23 is put into operation, for emitting a laser beam with 650 nm wavelength. The laser beam is reflected at the vertical mirror surface(the triangular column form, or the parabolic mirror form) toward the collimator 32 in the laser beam source package 31 with two wavelengths and collimated thereby. The laser beam collimated by the collimator 32 passes through the beam splitter 33, is directed to the objective lens 35 by the 45° reflector 34, and focused onto the DVD 37 by the objective lens 35. The 45° reflector 34 has an area 40 coated with a dielectric film on a surface thereof for making total reflection both of the 650 nm laser beam and the 780 nm laser beam, and an area 41 for making selective total reflection of the 650 nm laser beam only. The laser beam focused onto the DVD 37 is reflected at the DVD 37, to travel in a reverse path to incident to the beam splitter 33, where a portion of the laser beam is directed toward the photodetector 39, onto which the laser beam is focused by the focusing lens 36. The operation of the photodetector thereafter is identical to the related art.

Figure 12:
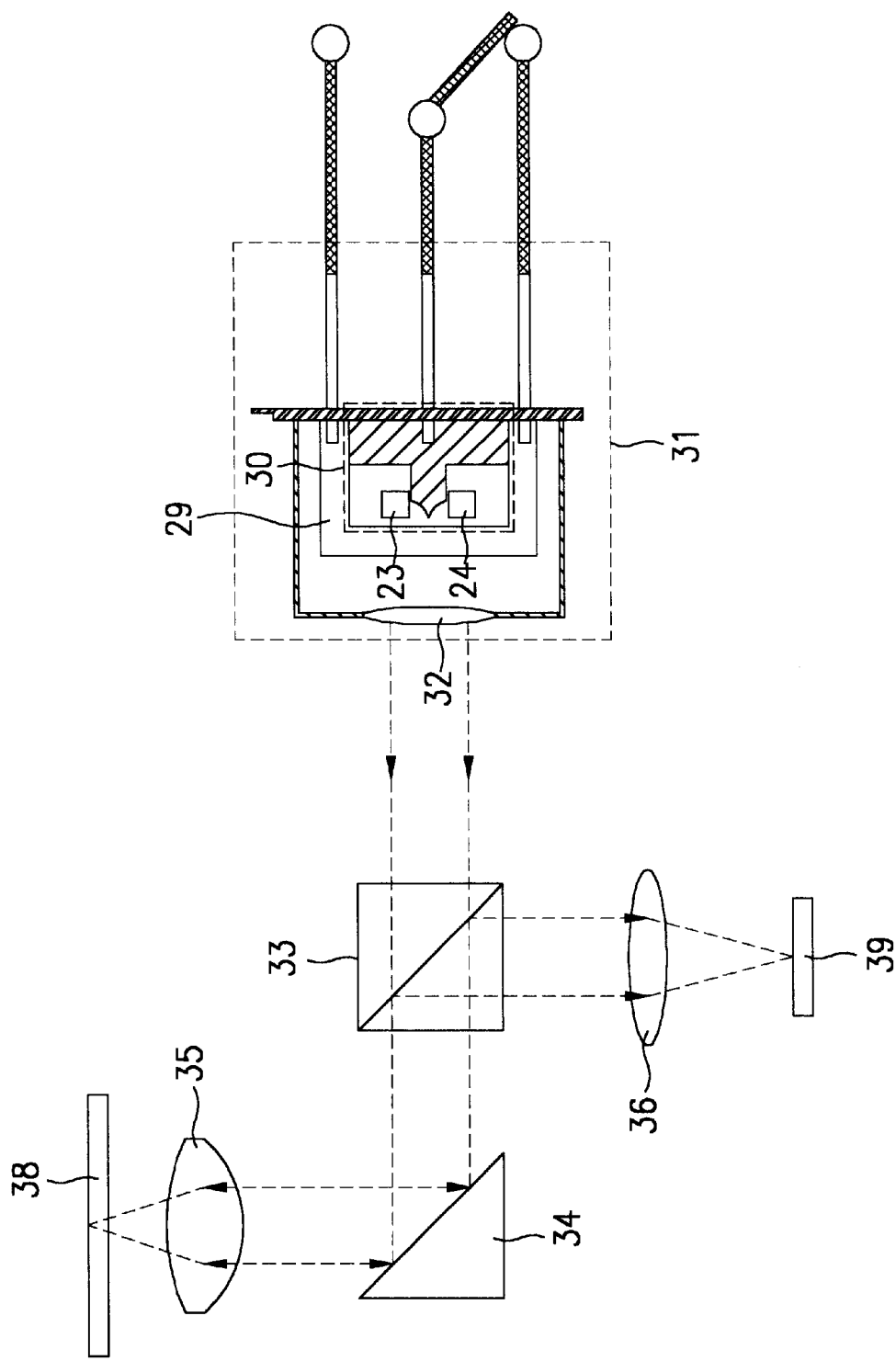

In the meantime, as shown in FIG. 12, when a CD is to be read, the 650 nm first laser diode 23 is turned off, and only the 780 nm second laser diode 24 is put into operation, such that, opposite to the case of the DVD, the laser beam is reflected at an opposite vertical mirror surface and travels along an optical axis. In this instance, the beam is absorbed in an outer area of a 45° reflector 34 surface, to reduce a size of beam spot, as the 45° reflector 34 provides an effect that the laser beam passes through an aperture. The operation thereafter is the same with the case of 650 nm first laser diode.

The light source module with two wavelengths of the present invention has the following advantages.

First, the integration of two light sources with different wavelengths into one module improves fabrication preciseness and productivity, and has a simple and easy fabrication process and an excellent reproducibility.

Second, the availability of a laser beam with two wavelengths from one module facilitates a simple and compact optical pickup.

It will be apparent to those skilled in the art that various modifications and variations can be made in the light source module with two wavelengths of the present invention without departing from the spirit or scope of the invention. Thus, it is intended that the present invention cover the modifications and variations of this invention provided they come within the scope of the appended claims and their equivalents.

What is claimed is:

1. A light source module with two wavelengths comprising:
   a first and a second laser diodes each for emitting a laser beam with a wavelength different from each other; and,
   a submount formed between the first and second laser diodes having a vertical mirror surface vertical to bonding surfaces of the first and second laser diodes for reflecting laser beams from the first and second laser diodes in a same direction.

2. A light source module as claimed in claim 1, wherein the submount has either alignment plates or alignment recesses for supporting and aligning the first and second laser diodes.

3. A light source module as claimed in claim 1, wherein the vertical mirror surface is either a flat or parabolic mirror disposed at 45° to the laser beams incident thereto.

4. A light source module as claimed in claim 1, wherein the vertical mirror surface has a reflection body formed of Al or Au.

5. A light source module as claimed in claim 1, wherein the vertical mirror surface has a height higher than heights of the first and second laser diodes.

6. A light source module as claimed in claim 1, wherein the submount has a recess having a mirror surface for re-reflecting the laser beam reflected at the vertical mirror surface in one direction.

7. A light source module as claimed in claim 6, wherein the mirror surface in the recess has a 45° slope.

8. A light source module as claimed in claim 1, wherein the submount has grooves formed along optical paths of the laser beams emitted from the first and second laser diodes.

9. A light source module as claimed in claim 1, further comprising:
   a stem for supporting the submount having the vertical mirror surface, and the first and second laser diodes; and,
   a cap fitted with a collimator, the cap formed over the stem for protecting the submount, and the collimator for collimating respective laser beams emitted from the first and second laser diodes and reflected at the vertical mirror surface toward an external optical system.

10. A light source module as claimed in claim 9, wherein the submount is vertical to the stem.

11. A light source module with two wavelengths comprising:
   a first and a second laser diodes each for emitting a laser beam with a wavelength different from each other;
   a mirror block disposed between the first and second laser diodes and having a vertical mirror surface for reflecting laser beams from the first and second diodes in the same direction; and,
   a submount having first, second and third recesses formed to a fixed depth under the first and second laser diodes and the mirror block, respectively, for aligning the first and second laser diodes and the mirror block, and a fourth recess formed to a fixed depth having a mirror surface for re-reflecting the laser beam reflected at the mirror block in a fixed direction.

12. A light source module as claimed in claim 11, wherein the mirror surface in the fourth recess of the submount has a 45° slope.

13. A light source module as claimed in claim 11, wherein the mirror surface in the fourth recess of the submount has a reflection film formed of Au or Al thereon.

14. A light source module as claimed in claim 11, wherein the submount is either a wafer cut at 9.7° off axis angle, or a wafer cut in parallel.

15. A light source module as claimed in claim 14, wherein the first, second and fourth recesses in the submount from the wafer cut at 9.7° off axis angle are formed in a <110> direction parallel to a primary flat of the wafer, and the third recess is formed in a <100> direction which is at 45° to the primary flat of the wafer.

16. A light source module as claimed in claim 15, wherein the mirror surface in the fourth recess is formed in (111) plane.

17. A light source module as claimed in claim 14, wherein the first, second and fourth recesses in the submount from the wafer cut in parallel are formed in a <100> direction which is at 45° to the primary flat of the wafer, and the third recess is formed in a <110> direction which is parallel to a primary flat of the wafer.

18. A light source module as claimed in claim 17, wherein the mirror surface in the fourth recess is formed in a (110) plane.

19. A light source module as claimed in claim 11, wherein the submount has grooves formed along paths of the laser beams emitted from the first and second laser diodes.

* * * * *